US008822922B1

(12) United States Patent
Scanlon et al.

(10) Patent No.: US 8,822,922 B1
(45) Date of Patent: Sep. 2, 2014

(54) PORTABLE MULTI-FUNCTION INSPECTION SYSTEMS AND METHODS

(75) Inventors: Tom Scanlon, Hampstead, NH (US); James T. Woolaway, Santa Barbara, CA (US); Robert P. Madding, Chelmsford, MA (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

(21) Appl. No.: 13/584,649

(22) Filed: Aug. 13, 2012

Related U.S. Application Data

(63) Continuation of application No. 12/966,951, filed on Dec. 13, 2010, now Pat. No. 8,242,445, which is a continuation of application No. 11/683,943, filed on Mar. 8, 2007, now Pat. No. 7,851,758, which is a continuation-in-part of application No. 11/403,534, filed on Apr. 12, 2006, now abandoned, which is a continuation-in-part of application No. 11/239,531, filed on Sep. 29, 2005, now abandoned.

(51) Int. Cl.
*G01J 5/00* (2006.01)
*G01J 5/02* (2006.01)
*G01J 5/08* (2006.01)

(52) U.S. Cl.
CPC .. *G01J 5/02* (2013.01); *G01J 5/089* (2013.01); *G01J 5/026* (2013.01); *G01J 5/025* (2013.01)
USPC ........... 250/330; 250/358.1; 73/584; 348/164

(58) Field of Classification Search
CPC ........... G01J 5/02; G01J 5/0275; G01J 5/089; G01J 5/0893; G01J 5/025; G01J 5/026; G01J 5/0265
USPC .............. 702/34, 35; 348/164, 163; 340/635, 340/588; 73/584; 250/330, 338.1, 339.14, 250/358.1, 338.5
See application file for complete search history.

(56) References Cited

U.S. PATENT DOCUMENTS

| 3,662,171 A | 5/1972 | Brengman et al. |
| 3,770,958 A | 11/1973 | Krakow |
| 3,849,005 A | 11/1974 | Girard et al. |
| 4,010,634 A | 3/1977 | Baumgartner |
| 4,063,096 A | 12/1977 | Roberts |
| 4,119,942 A | 10/1978 | Merklinger |

(Continued)

FOREIGN PATENT DOCUMENTS

| JP | 2002281655 | 9/2002 |
| KR | 10-2000-0064198 | 11/2000 |

(Continued)

OTHER PUBLICATIONS

Nielsen et al., "Guidelines to thermographic inspection of electrical installations", SPIE, vol. 2245, Thermosense XVI, 1994, pp. 2-13.

(Continued)

*Primary Examiner* — David Porta
*Assistant Examiner* — Yara B Green
(74) *Attorney, Agent, or Firm* — Haynes and Boone, LLP

(57) ABSTRACT

In accordance with at least one embodiment of the present invention, a portable inspection system is disclosed to wirelessly capture inspection data, such as for example an infrared image, sound information, and/or electrical measurement information. The inspection data may be securely recorded (e.g., with an encryption algorithm) along with associated information, which may include for example date, time, system settings, operator identification, and location.

20 Claims, 13 Drawing Sheets

(56) References Cited

U.S. PATENT DOCUMENTS

| | | |
|---|---|---|
| 4,390,785 A | 6/1983 | Faulhaber et al. |
| 4,489,239 A | 12/1984 | Grant et al. |
| 4,520,265 A | 5/1985 | Griggs et al. |
| 4,543,481 A | 9/1985 | Zwick |
| 4,806,761 A | 2/1989 | Carson et al. |
| 4,841,149 A | 6/1989 | Martin et al. |
| 4,899,053 A | 2/1990 | Lai et al. |
| 4,956,555 A | 9/1990 | Woodberry |
| 4,999,498 A | 3/1991 | Hunt et al. |
| 5,045,937 A | 9/1991 | Myrick |
| 5,061,854 A | 10/1991 | Kroutil et al. |
| 5,157,257 A | 10/1992 | Geiger |
| 5,197,295 A | 3/1993 | Pundak |
| 5,250,810 A | 10/1993 | Geiger |
| 5,306,913 A | 4/1994 | Noack et al. |
| 5,332,901 A | 7/1994 | Eckles et al. |
| 5,336,899 A | 8/1994 | Nettleton et al. |
| 5,339,070 A | 8/1994 | Yalowitz et al. |
| 5,386,117 A | 1/1995 | Piety et al. |
| 5,447,055 A | 9/1995 | Thompson et al. |
| 5,457,320 A | 10/1995 | Eckles et al. |
| 5,459,324 A | 10/1995 | Fima |
| 5,461,477 A | 10/1995 | Marinelli et al. |
| 5,499,294 A | 3/1996 | Friedman |
| 5,539,396 A | 7/1996 | Mori et al. |
| 5,565,783 A | 10/1996 | Lau et al. |
| 5,635,895 A | 6/1997 | Murr |
| 5,637,871 A | 6/1997 | Piety et al. |
| 5,656,813 A | 8/1997 | Moore et al. |
| 5,826,984 A | 10/1998 | Fima |
| 5,995,630 A | 11/1999 | Borza |
| 6,037,984 A | 3/2000 | Isnardi et al. |
| 6,061,141 A | 5/2000 | Goldenberg et al. |
| 6,078,874 A | 6/2000 | Piety et al. |
| 6,093,329 A | 7/2000 | McDougald |
| 6,157,033 A | 12/2000 | Chudnovsky |
| 6,230,105 B1 | 5/2001 | Harris et al. |
| 6,317,212 B1 | 11/2001 | Eckles |
| 6,396,056 B1 | 5/2002 | Lord et al. |
| 6,444,984 B1 | 9/2002 | Lundgren et al. |
| 6,568,848 B1 | 5/2003 | Chapman et al. |
| 6,665,490 B2 | 12/2003 | Copperman et al. |
| 6,756,592 B1 | 6/2004 | Smith et al. |
| 6,791,088 B1 | 9/2004 | Williams, II et al. |
| 6,803,577 B2 | 10/2004 | Edner et al. |
| 6,822,236 B1 | 11/2004 | Nelson et al. |
| 6,845,913 B2 | 1/2005 | Madding et al. |
| 6,846,913 B1 | 1/2005 | Kim et al. |
| 6,866,089 B2 | 3/2005 | Avila |
| 6,903,329 B2 | 6/2005 | Gentala |
| 6,956,500 B1 | 10/2005 | Ducharme et al. |
| 6,975,104 B2 | 12/2005 | Gregorec, Jr. |
| 7,075,289 B2 | 7/2006 | Chen |
| 7,100,424 B2 | 9/2006 | Wilson |
| 7,109,700 B2 | 9/2006 | Fazzina |
| 7,128,466 B2 | 10/2006 | Chang et al. |
| 7,157,705 B2 | 1/2007 | Hamrelius et al. |
| 7,176,656 B2 | 2/2007 | Feldmann |
| 7,305,327 B2 | 12/2007 | Sper |
| 7,312,603 B2 | 12/2007 | Luo et al. |
| 7,318,335 B2 | 1/2008 | Olesen et al. |
| 7,327,133 B2 | 2/2008 | Baker et al. |
| 7,454,050 B2 | 11/2008 | Garvey |
| 7,528,612 B2 | 5/2009 | Gollhardt et al. |
| 7,561,412 B2 | 7/2009 | Brandt et al. |
| 7,616,896 B2 | 11/2009 | Houck et al. |
| 7,722,248 B1 | 5/2010 | Chapman et al. |
| 2002/0075616 A1 | 6/2002 | Montjean |
| 2002/0145037 A1 | 10/2002 | Goodwin, III |
| 2003/0057371 A1 | 3/2003 | Wood |
| 2003/0189498 A1 | 10/2003 | Kakihara et al. |
| 2004/0019461 A1 | 1/2004 | Bouse et al. |
| 2004/0170277 A1 | 9/2004 | Iwamura et al. |
| 2004/0211900 A1 | 10/2004 | Johnson |
| 2005/0104764 A1 | 5/2005 | Young |
| 2005/0281456 A1 | 12/2005 | Garvey |
| 2006/0017821 A1 | 1/2006 | Garvey, III et al. |
| 2006/0048286 A1 | 3/2006 | Donato |
| 2006/0049930 A1 | 3/2006 | Zruya et al. |
| 2006/0050766 A1 | 3/2006 | Hollander et al. |
| 2006/0091310 A1 | 5/2006 | Furry |
| 2006/0132782 A1 | 6/2006 | Flanders et al. |
| 2006/0191341 A1 | 8/2006 | Olesen et al. |
| 2006/0289768 A1 | 12/2006 | Vallese et al. |
| 2007/0002929 A1 | 1/2007 | Frankel et al. |
| 2007/0083491 A1 | 4/2007 | Walmsley et al. |
| 2008/0211508 A1 | 9/2008 | Conti et al. |
| 2010/0134094 A1 | 6/2010 | Shah et al. |

FOREIGN PATENT DOCUMENTS

| | | |
|---|---|---|
| KR | 10-2005-0087757 | 8/2005 |
| KR | 10-2005-0092992 | 9/2005 |
| KR | 10-2006-0129576 | 12/2006 |
| WO | WO 2005/001409 | 1/2005 |
| WO | WO 2007/004897 | 1/2007 |

OTHER PUBLICATIONS

Engineering Talk [online], "Camera sets standard for practical thermography" Apr. 28, 2003 [retrieved on Apr. 21, 2008]. Retrieved from the internet<URL: http://www.engineeringtalk.com/news/fli/fli131.html>.

Wimmers et al., "Focal Plane Arrays: Better; Smaller IR Imagers for New Applications" The Photonics Design and Applications Handbook, 1997, pp. H-212 to H-217, Cincinnati Electronics Corp.

Kaliski, Burt, "RSA Data Security, Inc. PKCS #1", RSA Data Security, Mar. 1998, pp. 1-17.

Schneier, Bruce, "Signing Documents with Public-Key Cryptography and One-Way Hash Functions", Applied Cryptography, 1996, Second Edition, chapter 2, pp. 38-39.

Schneier, Bruce, "Public-Key Algorithms and Public-Key Digital Signature Algorithms", Applied Cryptography, 1996, Second Edition, chapters 19-20, pp. 461-502.

Madding et al., "Important measurements that support IR surveys in substations", Inframaton, 2002, pp. 7.

| Input Data | | | Output Data | | |
|---|---|---|---|---|---|
| | | | Maximum Allowable Load | | Amps |
| Problem Temperature | | °F | Maximum Allowable Temperature Rise | | F° |
| Reference Temperature | | °F | Temperature Rise Measured | | F° |
| Maximum Allowable Temperature | | °F | | | |
| Measured Load | | Amps | Load | | % |

CALCULATE

Select Temperature Units

PORTABLE MULTI-FUNCTION INSPECTION SYSTEMS AND METHODS

CROSS-REFERENCE TO RELATED APPLICATIONS

This continuation patent application claims priority to and the benefit of U.S. patent application Ser. No. 12/966,951 filed Dec. 13, 2010 (now U.S. Pat. No. 8,242,445), which is a continuation of U.S. patent application Ser. No. 11/683,943 filed Mar. 8, 2007 (now U.S. Pat. No. 7,851,758), which is a continuation-in-part (CIP) of U.S. patent application Ser. No. 11/403,534 filed on Apr. 12, 2006 now abandoned, which is a CIP of U.S. patent application Ser. No. 11/239,531 filed on Sep. 29, 2005 now abandoned, which are all incorporated herein by reference in their entirety.

TECHNICAL FIELD

The present invention relates generally to inspection systems, and more particularly, for example, to infrared inspection systems.

RELATED ART

Environmental and safety concerns may require periodic monitoring of production facilities or electrical devices and distribution systems, which may utilize toxic, flammable, controlled substances, or pose other types of hazards. For example in some production facilities, these substances pass through hundreds of pressurized pipes and tanks having thousands of seals, seams, and joints at various locations. As another example, an electrical distribution system may need to be monitored to detect potential device failures or other potentially hazardous situations.

In some cases, periodic inspection of the facilities at these locations must be documented to comply with various regulatory agency requirements or to ensure safe operation and avoid costly equipment failures. For example, failure to adequately document compliance with the requirements can result in a levy of fines against the offending facility and a halt to ongoing production until compliance can be verified.

With such a strong motivation to document compliance, there is also a possibility of fraud or inadvertent failures to properly comply. For example, an individual may wish to falsify a compliance report to indicate an area of the production facility was inspected, when it was not (e.g., only a portion of an inspection route was completed, while some other portion was not completed). Furthermore, an inspection procedure may require the inspector to be certified in some particular inspection capacity. Because it may be more expensive to acquire services from a certified inspector, there may be an attempt to utilize uncertified people. In this case, the inspection may have been completed, but may have been accomplished by an uncertified or unqualified person.

There are also safety issues involved for an inspector when inspecting some types of electrical equipment or other types of production facilities. For example, conventional types of inspection equipment may not provide sufficient information to the operator of the inspection equipment during an inspection procedure.

In view of these issues and others, there remains a need in the art for improved inspection systems that may reduce fraud, facilitate a more complete inspection or more trustworthy compliance verification, and/or provide adequate information to the inspector regarding potential hazards or inspection procedures so that the inspection is performed in a safe manner.

SUMMARY

Systems and methods are disclosed herein, in accordance with one or more embodiments of the present invention, to provide portable inspection systems. For example, the inspection system may provide secure recordation of inspection data, such as for example for infrared (IR) images within an infrared camera or to secure other types of inspection data within an inspection system (e.g., a portable inspection tool). As another example, the inspection system may provide safety information to the operator of the inspection system and warn the operator if unsafe inspection conditions exist or safety procedures are not followed. The inspection system may also use the information (e.g., measurements and other information obtained) to perform calculations to determine safe operating parameters of the equipment being inspected and provide the calculation results to the operator.

In accordance with an embodiment of the present invention, a camera system is disclosed for recording infrared images (e.g., one or more single frames or real time video), with the images securely recorded with the time and date of the recordation. The camera system may optionally include additional features to obtain additional information associated with the recordation. For example, information on the operator of the camera system, location, camera orientation, camera recordation settings, audio information, electrical measurements, distance measurements, and/or gas concentration information may be obtained at the time of the recordation and securely associated with the corresponding images.

More specifically in accordance with an embodiment of the present invention, an inspection system is disclosed to capture infrared images and to securely record date, time, and/or other relevant information along with the captured image. For example, the inspection system may securely record the information by employing a cryptographic hash function and a private key to sign the information and store for later verification. Alternatively or in addition, the infrared images may be encrypted using an encryption algorithm.

In accordance with another embodiment of the present invention, an inspection system includes an infrared camera adapted to capture image data of a target; means for capturing at least one of sound data and chemical data on the target; and a processor adapted to provide a signature for the image data and time and date of the image data capture and associated inspection information, wherein the associated inspection information provides at least one of a location of the infrared camera, an orientation of the infrared camera, operator information of the infrared camera, camera settings, target information, audio information, and gas concentration information.

In accordance with another embodiment of the present invention, a portable inspection system includes means for inspecting a target to obtain inspection data; means for obtaining a first set of information associated with the inspection data, wherein the first set of information comprises at least one of a setting of the inspecting means, a location of the inspecting means, an orientation of the inspecting means, operator information of the inspecting means, a time of obtaining the inspection data, a date of obtaining the inspection data, target information, an audio analysis, and a gas analysis; and means for generating a signature for the inspection data and the first set of information associated with the inspection data.

In accordance with another embodiment of the present invention, a method of securely recording inspection data within a portable inspection system includes inspecting a target with the inspection system to obtain inspection data comprising image data, sound data, and at least one of gas concentration data, vibration data, and lubrication data; determining at least one of target information and a location of the inspection system during the inspecting operation; determining a time and a date for the inspecting operation; and securing the inspection data, the time, the date, and at least one of the location and the target information within the inspection system with an encryption algorithm.

In accordance with another embodiment of the present invention, an inspection system includes an infrared detector adapted to capture infrared image data of an electrical component; a display adapted to display the infrared image data; a data entry device adapted to allow an operator to enter information into the inspection system; a memory adapted to store the infrared image data and the information provided via the data entry device, wherein the memory further stores at least one equation for performing computations based on temperature and electrical load measurements; and a processor, coupled to the memory, the display, the infrared detector, and the data entry device, adapted to execute the at least one equation and generate a result based on at least one temperature measurement derived from the infrared image data and at least one electrical load measurement stored in the memory.

In accordance with another embodiment of the present invention, a portable inspection system includes means for receiving infrared image data from an electrical component; means for displaying the infrared image data; means for entering information into the inspection system; means for storing the infrared image data, the information, and at least one equation for temperature and electrical load measurements; means for generating a result based on the at least one equation, at least one temperature measurement based on the infrared image data, and at least one electrical load measurement provided to the storing means; and means for obtaining a first set of information associated with the infrared image data, wherein the first set of information comprises a setting of the inspection system, a time of obtaining the infrared image data, a date of obtaining the infrared image data, and at least one of a location of the inspection system, operator information of the inspection system, and identification information associated with the electrical component In accordance with another embodiment of the present invention, a method of inspecting an electrical device with a portable inspection system includes receiving infrared image data from the electrical device; displaying the infrared image data with the inspection system; determining a temperature measurement based on the infrared image data; determining an electrical load measurement; storing at least one equation along with the electrical load measurement and the temperature measurement within the inspection system; and generating a result based on the at least one equation, the electrical load measurement, and the temperature measurement to provide at least one of an expected temperature and an allowable electrical load.

In accordance with an embodiment of the present invention, an inspection system includes an infrared camera adapted to capture infrared image data, wherein the infrared camera includes an infrared detector configured to receive thermal energy and generate the infrared image data; a memory configured to store the infrared image data; a display configured to display the infrared image data; and a controller, coupled to the display, the memory, and the infrared detector, configured to control the infrared detector and process the infrared image data to store in the memory and/or to view on the display. The inspection system may further include an extendable boom having a proximate end and a distal end; a sensor unit, coupled to the distal end of the extendable boom, having one or more sensors adapted to provide sensor information, the sensor unit configured to wirelessly communicate with the infrared camera to provide the sensor information; and wherein the one or more sensors comprise an electrical measurement device configured to measure an electrical parameter of an inspection target to provide as an electrical parameter value to the sensor unit to provide as the sensor information to the infrared camera.

In accordance with an embodiment of the present invention, an inspection system includes an infrared camera adapted to capture infrared image data, wherein the infrared camera includes an infrared detector configured to receive thermal energy and generate the infrared image data; a memory configured to store the infrared image data; a display configured to display the infrared image data; and a controller, coupled to the display, the memory, and the infrared detector, configured to control the infrared detector and process the infrared image data to store in the memory and/or to view on the display. The inspection system may further include a sensor unit having one or more sensors adapted to provide sensor information, the sensor unit configured to wirelessly communicate with the infrared camera to provide the sensor information for viewing on the display along with the infrared image data, and wherein the one or more sensors comprise a parameter measurement device configured to measure a parameter of an inspection target to provide as a parameter value to the sensor unit to provide as the sensor information to the infrared camera.

In accordance with an embodiment of the present invention, a method, of inspecting an inspection target with a portable inspection system, includes capturing infrared image data of the inspection target with the portable inspection system; processing the infrared image data within the portable inspection system; storing the infrared image data within the portable inspection system; displaying the infrared image data for viewing by a user of the portable inspection system; extending a boom of the portable inspection system towards the inspection target to capture, from a distal end of the boom, sensor information of the inspection target; communicating wirelessly the sensor information; receiving the sensor information; and displaying the sensor information with the infrared image data for viewing by the user of the portable inspection system.

The scope of the present invention is defined by the claims, which are incorporated into this section by reference. A more complete understanding of embodiments of the present invention will be afforded to those skilled in the art, as well as a realization of additional advantages thereof, by a consideration of the following detailed description. Reference will be made to the appended sheets of drawings that will first be described briefly.

BRIEF DESCRIPTION OF THE DRAWINGS

FIG. 15 shows an inspection station where an inspector is operating an inspection system to examine an inspection target for a possible electrical anomaly, in accordance with an embodiment of the present invention.

FIGS. 16 and 17 show examples of inspection system displays for data entry of information and calculation results in accordance with one or more embodiments of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
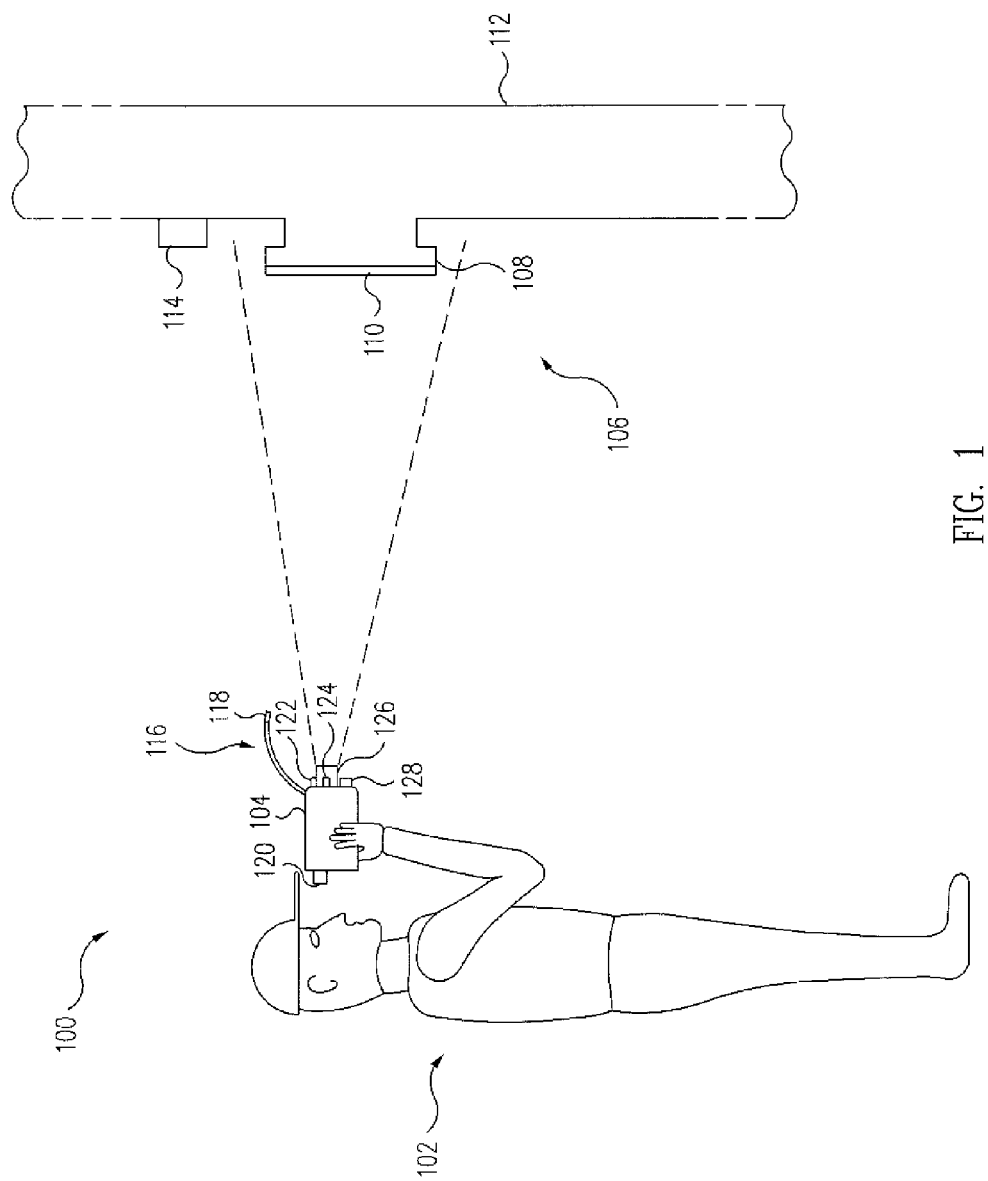
FIG. 1 shows an inspection station where an inspector is operating an inspection system to examine an inspection target, in accordance with an embodiment of the present invention.

FIG. 1 shows an inspection station 100, in accordance with an embodiment of the present invention, where an inspector 102 is operating an inspection system 104 to examine (e.g., view on a display 120 an image received via a lens 126) an inspection target 106 (e.g., a pipe or container for a possible gas leak as shown or an electrical device for defects or temperature anomalies, as discussed further herein). As shown in FIG. 1 for this example, target 106 may be any component of a production facility, such as a juncture 108 between a cover plate 110 mounted on a pipe 112 that conducts a gas or gas-emitting substance.

In this example, plate 110 is intended to seal the juncture 108 by compressing a gasket (not shown) between plate 110 and pipe 112 so that a failure in the gasket might result in a gas leak that is detected by inspection system 104. Alternatively, any portion of any component at inspection station 110 may be inspected because any portion of the pipe 112 or assembled plate 110 may develop a breach where gas may leak out. An inspection target identifier 114 may be mounted on or near inspection target 106. Inspection target identifier 114 may be used for identifying an associated inspection target 106 or inspection station 100, as explained further herein.

Inspection system 104 may optionally include an extendable boom 116 that may support and/or contain one or more sensors 118 as disclosed herein. Inspection system 104 may also optionally include a light 122, a laser rangefinder 124, and/or one or more microphones 128. Light 122 may be used to illuminate the inspection scene, the inspection target, and/or a gas cloud formed due to the possible breach in order to provide better visualization of a target or background scene, contrast between a gas cloud and the background scene, and/or detectability of one or more particular gas components. Light 122 may be mounted either on a portion of extendable boom 116 or on a body portion of inspection system 104, as shown, and may for example emit illumination in an infrared range, a visible range, and/or an ultraviolet range, depending upon a desired application. Similarly, laser rangefinder 124 and/or microphone 128 may be either on a portion of extendable boom 116 or on a body portion of inspection system 104.

Laser rangefinder 124 may be used to provide a narrow beam of coherent light used to reflect off a portion of a gas cloud, inspection target, or scene background object in order to measure the distance from a particular item of interest. Laser rangefinder 124 may produce a signal that is recorded as additional inspection information such as to provide distance information. This distance information may be used for example, as discussed further herein, to help inspector 102 maintain a safe distance from target 106. Microphone 128 may be used to record audio information from inspector 102 or from target 106 and may also provide directional cues to inspector 102, as discussed further herein.

Figure 2:
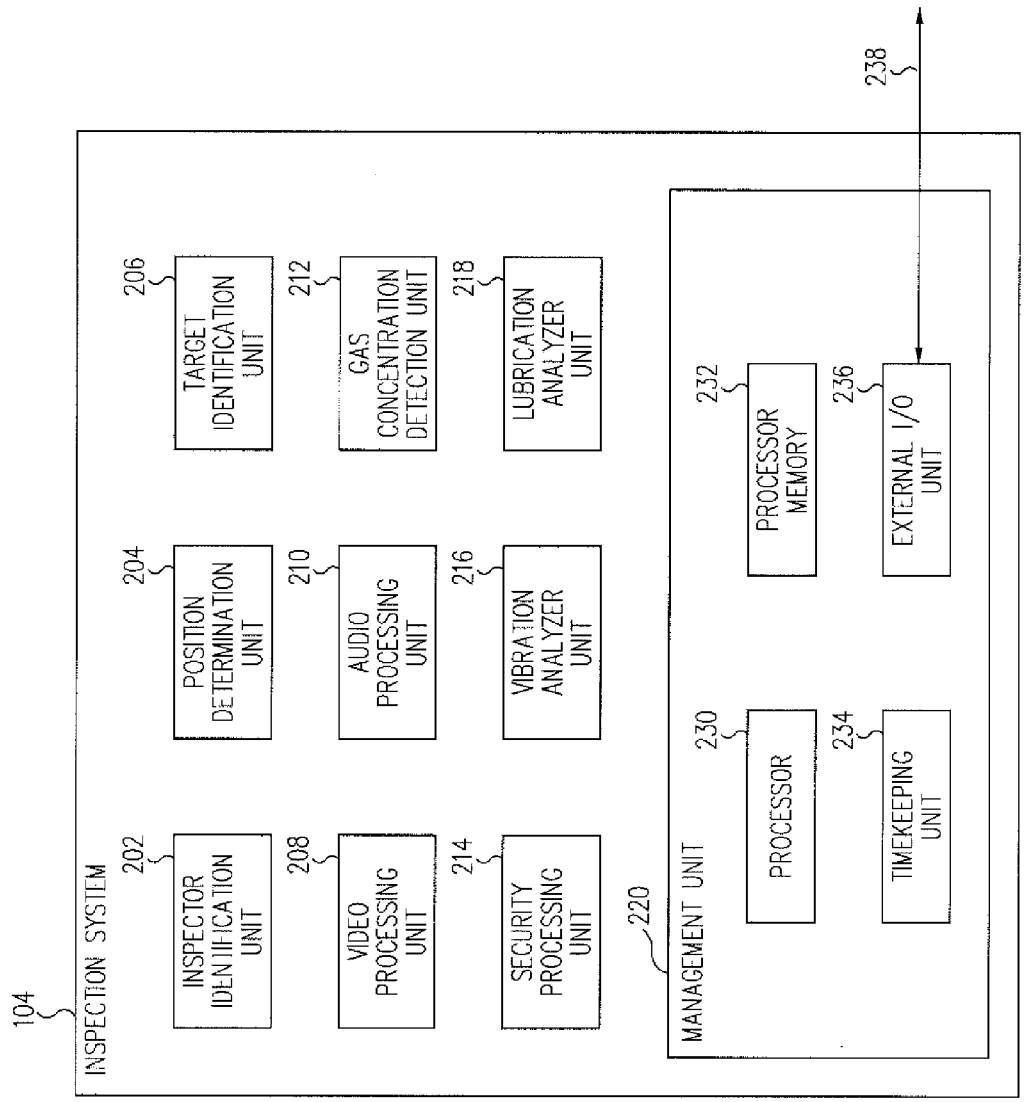
FIG. 2 shows a block diagram view of an inspection system, in accordance with an embodiment of the present invention.

FIG. 2 shows an exemplary block diagram view of inspection system 104 in accordance with an embodiment of the present invention. Inspection system 104 includes a video processing unit 208 and a management unit 220 and may further include one or more optional functional blocks or units including an inspector (operator) identification unit 202, a position determination unit 204, a target identification unit 206, an audio processing unit 210, a gas concentration detection unit 212, a security processing unit 214, a vibration analysis unit 216, and/or a lubrication analysis unit 218.

It should be understood that the block diagram of inspection system 104 (FIG. 2) represents exemplary functional aspects of inspection system 104. Therefore, one or more functional blocks may be optional (e.g., inspector identification unit 202, position determination unit 204, target identification unit 206, audio processing unit 210, gas concentration detection unit 212, security processing unit 214, vibration analysis unit 216, lubrication analysis unit 218, and/or timekeeping unit 234 may be optional), depending upon the application or requirements. Furthermore, one or more of the functional blocks of inspection system 104 (FIG. 2) may be combined to share common functions or circuitry (e.g., common processor or memory). For example, management unit 220 may represent the control and processing functions for inspection system 104 and include various functional aspects of inspection system 104 (e.g., including performing security processing unit 214 functions, vibration analyzer unit 216 functions, and/or lubrication analyzer unit 218 functions) and/or may be included within one or more of the functional blocks of inspection system 104 (e.g., within video processing unit 208).

In general, the exemplary block diagram view of inspection system 104 in FIG. 2 may be viewed as a processor or other type of controller to perform the inspection functions of inspection system 104 and to securely record the inspection data and associated information, as disclosed herein. Furthermore, although shown as separate functional units, some or all of the communications and data processing functions of inspection system 104 may functionally be performed by processor 230. Also, portions of some functional units may be combined or reorganized at a different level of hierarchy.

For example, vibration analysis unit 216 may operate individually or in concert with one or more functional units such as for example audio processing unit 210 to capture inspection information (e.g., a vibration signature for a mechanical device such as rotating machinery). Alternatively, vibration analysis unit 216 may capture the vibration signature using mechanical conduction or radio detection techniques as would be understood by one skilled in the art.

As another example, lubrication analysis unit 218 (i.e. an oil analyzer) may include a wet sensor (not shown) and may operate individually or in concert with one or more functional units such as for example gas concentration detection unit 212 to capture inspection information (e.g., contamination or chemical breakdown of a lubricant). Furthermore, lubrication analysis unit 218 may perform an analysis of a lubrication sample to provide an early detection of wear and/or corrosion of a lubricated mechanical device as would be understood by one skilled in the art. In this manner, vibration analysis unit 216 and lubrication analysis unit 218 may be considered a mechanical analysis unit.

Management unit 220 communicates with and controls various functions within inspection system 104 to securely capture one or more video images of or other information from an inspection target (e.g., when the identity of the inspection system operator is recorded or verified and the position of the inspection system is determined or matches pre-defined or predetermined conditions). Management unit 220 includes a processor 230 and a processor memory 232, such as a suitably programmed microcomputer. Processor 230 controls communications within inspection system 104 and may perform computations to implement inspection algorithms. Processor memory 232 may be implemented in one or more technologies including a Random Access Memory (RAM), Read Only Memory (ROM), a magnetic disc, an optical disc, or other data storage and retrieval mediums. Processor 230 reads and executes instructions contained within processor memory 232 to operate inspection system 104, for example, to perform computations and communicate within inspection system 104.

In order to accurately monitor the time and date of inspection events, management unit 220 may include a timekeeping unit 234 that may generate time and date information for use in marking captured images. Alternatively, time and date information for inspection system 104 may be obtained from position determination unit 204 (e.g., GPS) and, thus, timekeeping unit 234 would not be required. Management unit 220 may also record the position of inspection system 104 for an operator traversing an inspection route using position information provided by position determination unit 204. Finally, management unit 220 includes an external input/output unit 236 that is configured to send and receive data and instructions over an external connection 238 that may be implemented as a wireless connection (e.g., radio frequency such as Bluetooth™ or an optical communications link) or a wired connection, with one or more devices enabled to send information to or receive information from inspection system 104. Processor 230 may also communicate over external connection 238 with an Internet server to transfer information, such as for example synchronization information for timekeeping unit 234.

Figure 3:
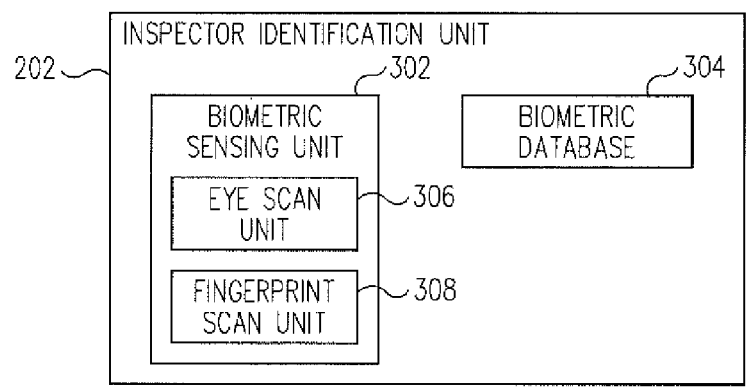
FIG. 3 shows a block diagram view of an inspector identification unit, in accordance with an embodiment of the present invention.

FIG. 3 shows an exemplary block diagram view of inspector identification unit 202 in accordance with an embodiment of the present invention. Inspector identification unit 202 may employ biometric technology and include a biometric sensing unit 302, for sensing or reading a biometric attribute of an inspection system operator, and a biometric database 304, for storing and retrieving biometric data corresponding to one or more operators. For example, biometric sensing unit 302 may read a fingerprint or thumbprint of an operator to capture a biometric sample that is stored in biometric database 304 and/or compared with biometric sample data stored in biometric database 304. Similarly, biometric sensing unit 302 may examine the eye of an operator to capture a biometric sample that is stored in biometric database 304 and/or compared with biometric sample data stored in biometric database 304.

As an example, if the biometric sample taken by biometric sensing unit 302 matches the information stored in biometric database 304, the operator may be authenticated as an authorized operator either during an inspection operation, or to unlock or activate the inspection system prior to use. In this manner, inspector identification unit 202 is configured to record and/or determine the identity of an operator of inspection system 104. Biometric data stored in biometric database 304 may be loaded from previously captured operator data or may be loaded through an initial operator validation process. Alternatively, the identification of the inspector may be obtained through a keypad or operator input, such as a corresponding password or secure key (e.g., secure RSA key, discussed further herein).

Figure 4:
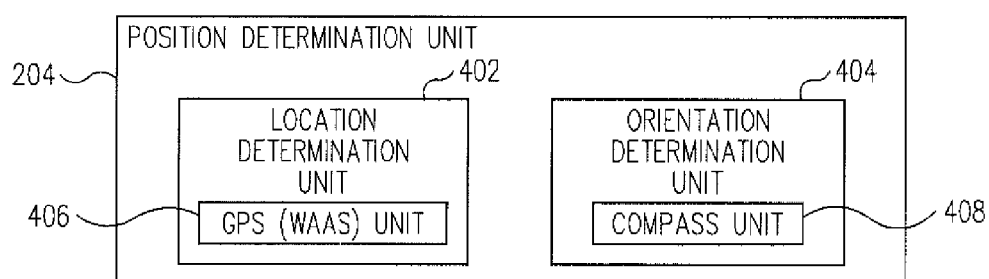
FIG. 4 shows a block diagram view of a position determination unit, in accordance with an embodiment of the present invention.

FIG. 4 shows an exemplary block diagram view of position determination unit 204 in accordance with an embodiment of the present invention. Position determination unit 204 may include a location determination unit 402 and/or an orientation determination unit 404 to provide position information of inspection system 104. Location determination unit 402 may include a Global Positioning Satellite (GPS) unit 406. In order to achieve higher accuracy, GPS unit 406 may be enabled with Wide Area Augmentation System (WARS) technology where GPS unit 406 receives a correction signal generated based on data from a plurality of ground reference stations to further refine the accuracy of the position information. Other technologies such as Differential GPS (DGPS) may also be used in order to improve position detection accuracy. Alternatively, location determination unit 402 may employ other location determination techniques, using for example cellular signals (e.g., triangulation) or other GPS-type or wide area network signal location techniques.

Orientation determination unit 404 may include a compass unit 408 for measuring the rotational position of inspection system 104 based on a reference heading. For example, compass unit 408 may measure the rotational deviation of inspection system 104 as measured from a magnetic north direction based on the earth's magnetic field. Other rotational deviations may be detected on up to three orthogonal axes using various gyroscopic technologies. Rotation on these three axes may be used to specify the pan and tilt of inspection system 104 in order to clearly document the location, position, and viewing angle of an inspection system operator. Laser rangefinder 124 (FIG. 1) may also be used to accurately determine distance to the object of interest within the field of view.

Consequently as an example, using one or more of these techniques with inspection system 104, sufficient information may be gathered to identify the specific location, orientation, etc. for obtaining future images of a desired area or object of interest. As an example, image comparisons, image subtraction or differentiation, or other types of imaging techniques (e.g., over various time periods) may be performed as would be understood by one skilled in the art by using the position information, orientation, distance, and/or other information gathered by and stored within inspection system 104.

Figure 5:
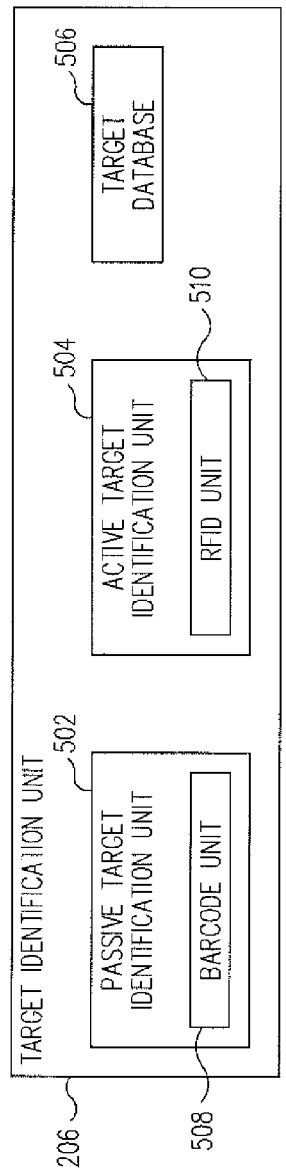
FIG. 5 shows a block diagram view of a target identification unit, in accordance with an embodiment of the present invention.

FIG. 5 shows an exemplary block diagram view of target identification unit 206 in accordance with an embodiment of the present invention. Target identification unit 206 may include a passive target identification unit 502, an active target identification unit 504, and/or a target database 506 for storing and retrieving target information. In reference to both FIGS. 1 and 5, target identifier 114 may include a passive device for reading by a scanner such as a bar code or other line-of-sight readable symbol in order to identify an inspection target. Alternatively or in addition, target identifier 114 may include an active device such as a Radio Frequency Identification (RFID) tag that does not require direct line-of-sight access in order to identify the inspection target. RFID units respond to a radio frequency (RF) query from an RFID reader and reply with tag information that is used to identify the inspection target. Any combination of passive and active target identifiers may be used including, for example, an active target identifier for identifying a station or general region of inspection having a plurality of inspection targets, where each target at the station is identified with a passive target identifier.

Passive target identification unit 502 may read a passive target identifier 114 and produce target identifier information (e.g., serial number or other information) that is used to identify an associated inspection target 106 or station 100. This identifying information may be associated with a particular inspection target 106 or inspection station 100 so that, by reading the target identifier, one may determine the inspection target or station. Passive target identification unit 502 may include a barcode unit 508 to read a passive target identifier such as a barcode, while active target identification unit 504 may include an RFID unit 510 to read from and/or write to an active target identifier such as an RFID tag. Alternatively, a barcode or other target identifier may be read by a camera as will be discussed in reference to FIG. 6 below. Target database 506 includes a memory for storing and retrieving target identifier information for a plurality of target identifiers as well as association information to link each target identifier with an inspection target, station, or both. Therefore, an inspection target is identified, for example, when the passive and/or active target identification information matches target database information in the target database.

Figure 6:
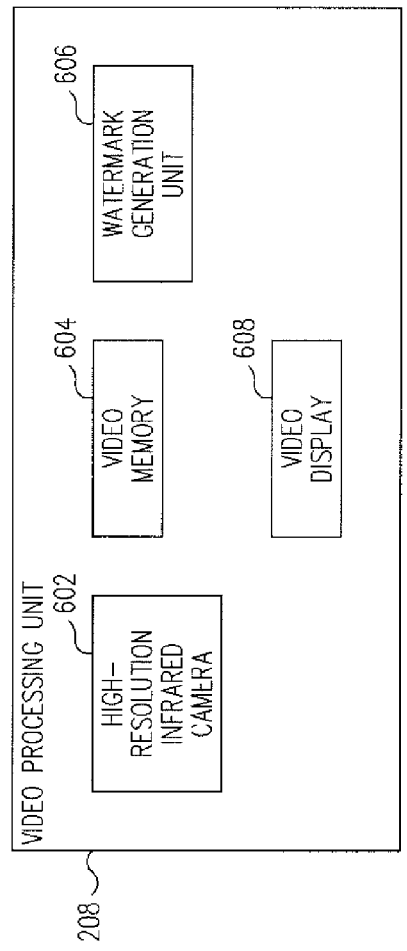
FIG. 6 shows a block diagram view of a video processing unit, in accordance with an embodiment of the present invention.

FIG. 6 shows an exemplary block diagram view of video processing unit 208 in accordance with an embodiment of the present invention. Video processing unit 208 may include an infrared camera 602 (e.g., a high-resolution IR camera), a video memory 604, a watermark generation unit 606, and/or a video display 608. Camera 602 is configured to capture still and/or moving infrared images and produce image signals representing the captured images. Camera 602 may include a processor to perform management unit 220 functions, as would be understood by one skilled in the art.

Camera 602 may capture, for example, an image having picture elements, or pixels, with approximately 65,536 shades or gradations on a grayscale from white to black to detect gas leaks that cannot be recognized by a human observer, but that are visible using the high-resolution provided by camera 602. The high-resolution images captured by camera 602 may be coarsened, for example, to only 256 gradations to save memory storage space once the desired features from the image have been extracted or a lower resolution image is sufficient for the desired application.

The image signals from camera 602 may be converted into a digital image format that may be stored in and retrieved from video memory 604. The captured images may be stored in a raw format or a standard format complying with an industry standard such as the Joint Photographic Experts Group (JPEG) family of standards, or Moving Picture Experts Group (MPEG) family of standards, for example. Video display 608 may be used to replay captured images for review by the inspector or others. Infrared camera 602 may be used to capture an image of a barcode or other target identifier, where the captured image may be scanned either at the time of capture or at a later processing time to extract target identifier information such as the bar code number or character sequence. One or more target markers on, at, or near the target identifier may be used to locate the target identifier orientation in the captured image in order to properly extract the barcode information. Exemplary embodiments of camera 602 may include the Photon, ThermaCam®, InfraCAM™, or Micro thermal imaging systems manufactured by FLIR Systems™, Incorporated (corporate headquarters in Wilsonville, Oreg.).

Watermark generation unit 606 may optionally be included to receive the digital image information and produce a new digital image having embedded information intended to identify (e.g., authenticate) the new image. The term watermark derives from the historical practice of including faintly visible words or graphics with a printed document, often within the actual paper before printing, where the words or graphics are designed to verify the authenticity or validate the source of the printed document. In traditional digital watermarking, a hidden pattern of information bits are inserted into a digital image file that provides copyright information related to the image such as the author's name, or contact information for reproduction rights, for example. In this disclosure, the term watermarking includes any practice of inserting any information into the digital image related to the captured image or the current state (e.g., date, time, position, and/or operator) of inspection system 104.

In addition to or instead of altering the digital image file, the identifying (e.g., authenticating) information may be included in a header file appended to, collocated, or associated with the captured image file data. The header and/or embedded information may include any information related to the captured image or the current state of inspection system 104, including the date and/or time of image capture, the operator, the location and/or orientation of inspection system 104 during image capture, and the target identifier information, for example. The header and/or embedded information, for example, may also include camera setting information on how the image was recorded, such as whether an image was considered radiometric or non-radiometric. For this disclosure, the term radiometric includes an assessment of a camera's ability to accurately convert radiated energy to object temperatures. For documentation purposes it may be desirable to record, with the radiometric image data, camera radiometric parametric data such as emissivity settings, background temperature values, optics parameters, filter parameters, target distance, camera range settings, and/or other thermographic setting information. These parameters may also be stored, for example, in the image header file.

Figure 7:
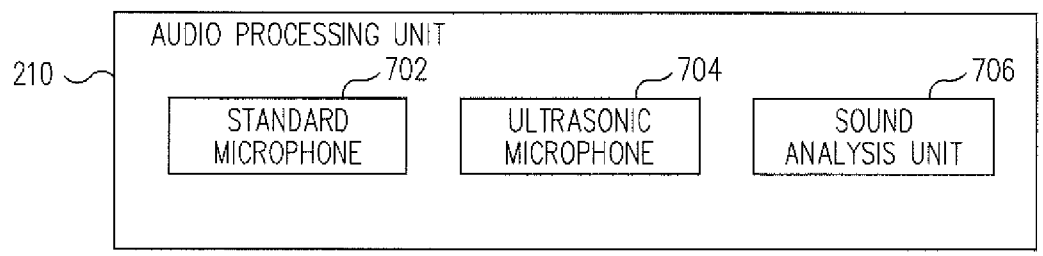
FIG. 7 shows a block diagram view of an audio processing unit, in accordance with an embodiment of the present invention.

FIG. 7 shows an exemplary block diagram view of audio processing unit 210 in accordance with an embodiment of the present invention. Audio processing unit (APU) 210 may include a standard microphone 702, an ultrasonic microphone 704, and/or a sound analysis unit (SAU) 706. Audio processing unit 210 may analyze and/or record at least some portion of sounds related to an inspection, such as sounds associated with a suspected gas leak. Standard microphone 702 detects sound in a frequency range of between about 20 Hz to about 20 kHz, for example, and produces a corresponding standard microphone output signal. Ultrasonic microphone 704 detects sound in a frequency range of between about 20 kHz to about 30 kHz, for example, and produces a corresponding ultrasonic microphone output signal. In this manner, audio processing unit 210 may be considered an ultrasonic analysis system and may operate functionally with or be incorporated with vibration analyzer unit 216.

SAU 706 receives the microphone output signals and extracts audio inspection information that may be used to determine the presence and/or location, for example, of a gas leak. The extracted information may be composed of sound components, such as sound frequency, sound intensity, and/or sound fluctuations that may indicate a gas leak or other inspection artifact. SAU 706, for example, may be optional and some or all operations may be functionally performed by processor 230 and/or by vibration analyzer unit 216, as discussed in reference to FIG. 2.

The recorded sound, sound components, and/or sound analysis results may optionally be incorporated within a header file appended to, collocated, or associated with a captured image file data. The captured image may be a sequence of images comprising a video movie or a single image. The recorded sound and/or components may similarly be a sequence of sounds comprising an audio stream or a snapshot of the sound converted to a time-weighted frequency distribution showing a characteristic audio profile of an inspection target and/or a suspected leak.

Figure 8:
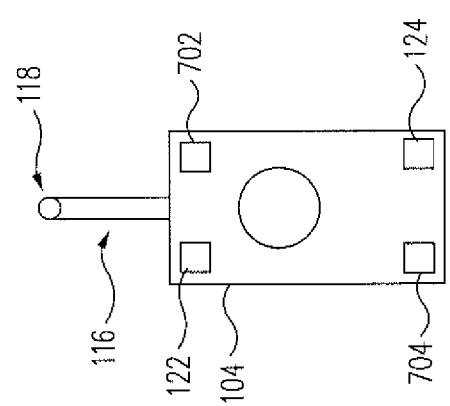
FIG. 8 shows a front plan view of an inspection system, in accordance with an embodiment of the present invention.

FIG. 8 shows a front plan view of inspection system 104, in accordance with an embodiment of the present invention, illustrating an exemplary diagonal placement with standard microphone 702 in a top-right position and ultrasonic microphone 704 in a bottom-left position. Alternatively, microphones 702 and 704 may be positioned as desired on or within inspection system 104, such as for example mounted together or separately to extend out from inspection system 104, depending on the application. Light 122 and laser rangefinder 124 are also shown, as discussed previously in reference to FIG. 1 for inspection system 104.

For example, a sensor 118 may be positioned on an end portion of either a fixed, extendable, or detachable boom 116. Sensor 118 may also include for example at least a portion of either audio processing unit 210 and/or gas concentration detection unit 212. For example, in one embodiment, sensor 118 may include standard microphone 702 and/or ultrasonic microphone 704. Alternatively, sensor 118 may be located in a fixed position on or within inspection system 104 (i.e., boom 116 optional). In yet another alternative embodiment, when boom 116 is detachable, an operator may grasp a portion of boom 116 and remove boom 116 from a body portion of inspection system 104. In this case, sensor 118 may communicate with inspection system through a fixed wire connection such as a retractable or elasticized cable (not shown), through a wireless radio-frequency (RF) link, or an optical communication link.

In this manner, an operator may extend sensor 118 towards an inspection target separate from the inspection body for various advantageous reasons, including to obtain a sensor reading while maintaining the inspection system body at a safer distance, to document the motion and/or location of sensor 118 within the field of view of the captured image, or to provide the capture of a larger visual scene area. In this manner, an inspection system operator may safety detect the presence of a hazard before entry into a hazardous situation.

Sensor 118 may also include or represent an electrical measurement device (e.g., a multimeter or a clamp meter) for measuring various electrical parameters, such as voltage, current, or resistance. For example, sensor 118 may represent an amp meter (e.g., a clamp-on amp meter or an Ampstik®), with boom 116 representing a telescoping hot stick (e.g., for high voltage applications) that may be attached to inspection system 104 or carried separately as discussed further herein (e.g., in reference to FIG. 15).

Figure 9:
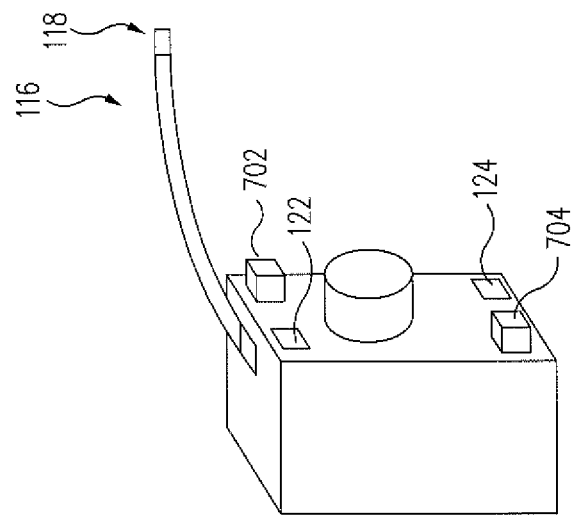
FIG. 9 shows a side plan view of an inspection system, in accordance with an embodiment of the present invention.

FIG. 9 shows a side plan view of inspection system 104 according to an embodiment of the present invention. The vertical and horizontal displacement of the standard microphone 702 and ultrasonic microphone 704 shown in respective FIGS. 8 and 9 allows stereoscopic sound detection which may optionally be used for location of a suspected leak source. The video processing unit 208 (as shown in FIG. 6) and the audio processing unit 210 (as shown in FIG. 7) may be calibrated so that the suspected gas leak source, or other audio source of interest, may be annotated on one or more captured images indicating more precisely the location of the suspected leak. Additionally, visual cues may be presented to an inspection system operator in the form of arrows displayed on video display 608, for example, to assist in identifying the location of a suspected leak by providing pan and/or tilt pointing directions to the operator.

Figure 10:
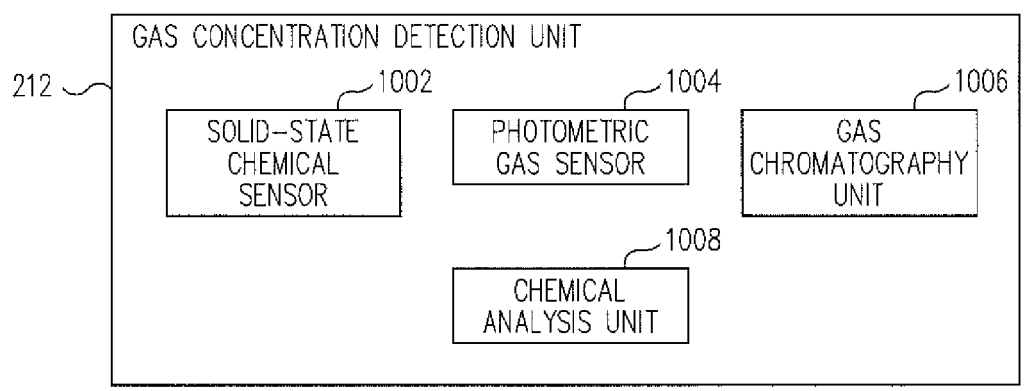
FIG. 10 shows a block diagram view of gas concentration detection unit, in accordance with an embodiment of the present invention.

FIG. 10 shows an exemplary block diagram view of gas concentration detection unit 212 in accordance with an embodiment of the present invention. Gas concentration detection unit 212 may be referred to colloquially as a "sniffer" which may include a solid-state chemical sensor 1002, a photometric gas sensor 1004, a gas chromatography unit 1006, and/or a chemical analysis unit (CAU) 1008. Solid-state chemical sensor 1002 may comprise a single sensor or a sensor array that may sense, for example, the presence of a chemical element or compound. For example, solid-state chemical sensor 1002 may comprise a sintered metal oxide semiconductor (MOS) element such as provided by Figaro Engineering, Incorporated of Glenview, Ill.

An exemplary solid-state chemical sensor may detect the presence and concentration of one or more gases through a change in electrical conductivity when a reducing gas is adsorbed on one or more sensor surfaces. The types of gases sensed by gas concentration detection unit 212 may include combustible gases, toxic gases, organic solvents, and/or hydrocarbons and other byproducts of an oil refining operation. Specifically, gas concentration detection unit 212 may detect methane, propane, hydrogen, carbon monoxide, ammonia, hydrogen sulfide, alcohol, toluene, xylene, refrigerant gases, and/or other volatile organic compounds (VOCs). Alternatively, solid-state chemical sensor 1002 may include, for example, one or more chemically sensitive resistance elements that may change in electrical resistance values based on the presence and/or concentration of one or more gases. In both the MOS and chemical resistor examples, a library of solid-state detection profiles may be stored corresponding to each expected type of detectable gas.

Photometric gas sensor 1004 may comprise a single photometric detector or an array of detectors that may detect the presence and composition of one or more gases using photometric techniques relying on the ultra-violet (UV) or visible light absorption of various gas-phase chemical and chemical compounds to determine the presence and concentration of various gases. Photometric gas sensor 1004 may include an illumination chamber including one or more light sources and one or more photodetectors. A library of photometric detection profiles may be stored corresponding to each expected type of gas.

Gas chromatography unit 1006 may comprise a single chromatographic detector or an array of detectors that may detect the presence, composition, and/or concentration of one or more gases using chromatographic techniques where a gas sample in a fixed size combustion chamber or column (not shown) is heated through electrical or chemical means so that the contained gas sample emits light in various spectra corresponding to the chemical composition of the gas sample. By detection of the emitted light spectra, the chemical composition of the gas sample may be known. Further, because the size of the combustion chamber is known, by the intensity and duration of the emitted light spectra, the quantity or concentration of the constituent parts of the gas sample may be known. In this manner, both the composition and concentration of the gas may be determined. A library of chromatographic detection profiles may be stored corresponding to each expected type of gas.

Solid-state chemical sensor 1002, photometric gas sensor 1004, and/or gas chromatography unit 1006 may operate independently or cooperatively to provide gas concentration measurement information to chemical analysis unit 1008 regarding the presence, composition, and/or concentration of one or more detected gases. Chemical analysis unit 1008 may produce a gas concentration output that may optionally be incorporated within the header file appended to, collocated, or associated with the captured image file data. Chemical analysis unit 1008, for example, may be optional and some or all operations may be functionally performed by processor 230, as described in reference to FIG. 2.

As described in reference to FIG. 9, sensor 118 may also include at least a portion of gas concentration detection unit 212. For example, sensor 118 may comprise a portion of solid-state chemical sensor 1002, a photometric sensor 1004, and/or a gas chromatography unit 1006. When sensor 118 is located at or near the end of extendable boom 116, sensor 118 may extend away from an operator in order to perform detection within undisturbed ambient air. Alternatively, when boom 116 is extended, sensor 118 may be inserted into a gas storage area or other narrowly accessible location, or within a suspected gas cloud or leak area. Because inspection system 104 is easily transportable, an operator may complete a survey, such as a walking survey, satisfying any combination of station-specific, periodic, or continuous monitoring requirements in accordance with one or more Environmental Protection Agency (EPA) methods, United States Federal Test Procedures (FTPs), and/or industry related rules or regulations.

Figure 11:
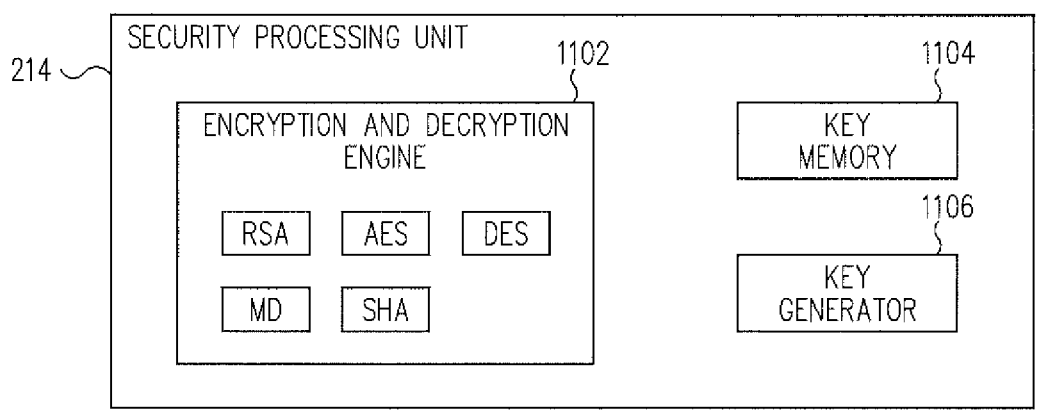
FIG. 11 shows a block diagram view of a security processing unit, in accordance with an embodiment of the present invention.

The inspection information collected by inspection system 104 may be stored using various techniques. For example, watermark generation unit 606 (FIG. 6) may be used to produce a new header file having embedded information, or the watermark could be appended to the header. The header and/or embedded information may also include an encrypted or plaintext signature for authentication of the image. Furthermore, in reference to FIG. 11, security processing unit 214, in accordance with an embodiment of the present invention, may provide encryption and decryption processing for information related to the watermark, image file, and/or header (e.g., the image header file and/or embedded information).

Security processing unit 214 includes an encryption and decryption engine 1102, a key memory 1104, and a key generator 1106. Engine 1102 provides encryption and decryption processing according to any one of several private or public key encryption or signature algorithms including the RSA algorithm (by RSA Security of Bedford, Mass.), the Digital Encryption Standard (DES), the Advanced Encryption Standard (AES), and broad families of signature or hash algorithms such as the Secure Hash Algorithm (SHA) and the Message Digest (MD) algorithm. Key memory 1104 is configured to store and retrieve cryptographic keys. Key generator 1106 is configured to generate a new cryptographic key.

The header and/or embedded (e.g., watermark) information discussed above may be secured by encryption prior to inclusion within the image data (e.g., secure header or embedded information along with the image information in order to identify and validate the captured image). For example, information exchanged with an active target identifier, such as an RFID, may be secured within the header (or watermark) through encryption. Additionally for example, a secure time and date stamp, operator identification, orientation, camera settings (e.g., radiometric information), location, electrical measurements, calculations, and/or other inspection information may be recorded within the header (or watermark).

In general depending upon the level of security desired and the specific requirements or applications, the image data (e.g., high resolution data) may not have to be encrypted. For example, by not encrypting the image file, considerable savings may be achieved in terms of processing, power savings, time, and/or memory. Thus, the image data may be securely recorded and validated by generating an associated signature that may be verified. Consequently, the image data is viewable and useable in a conventional fashion (e.g., using conventional imaging or display techniques), but is also verifiable through the signature.

Figure 12:
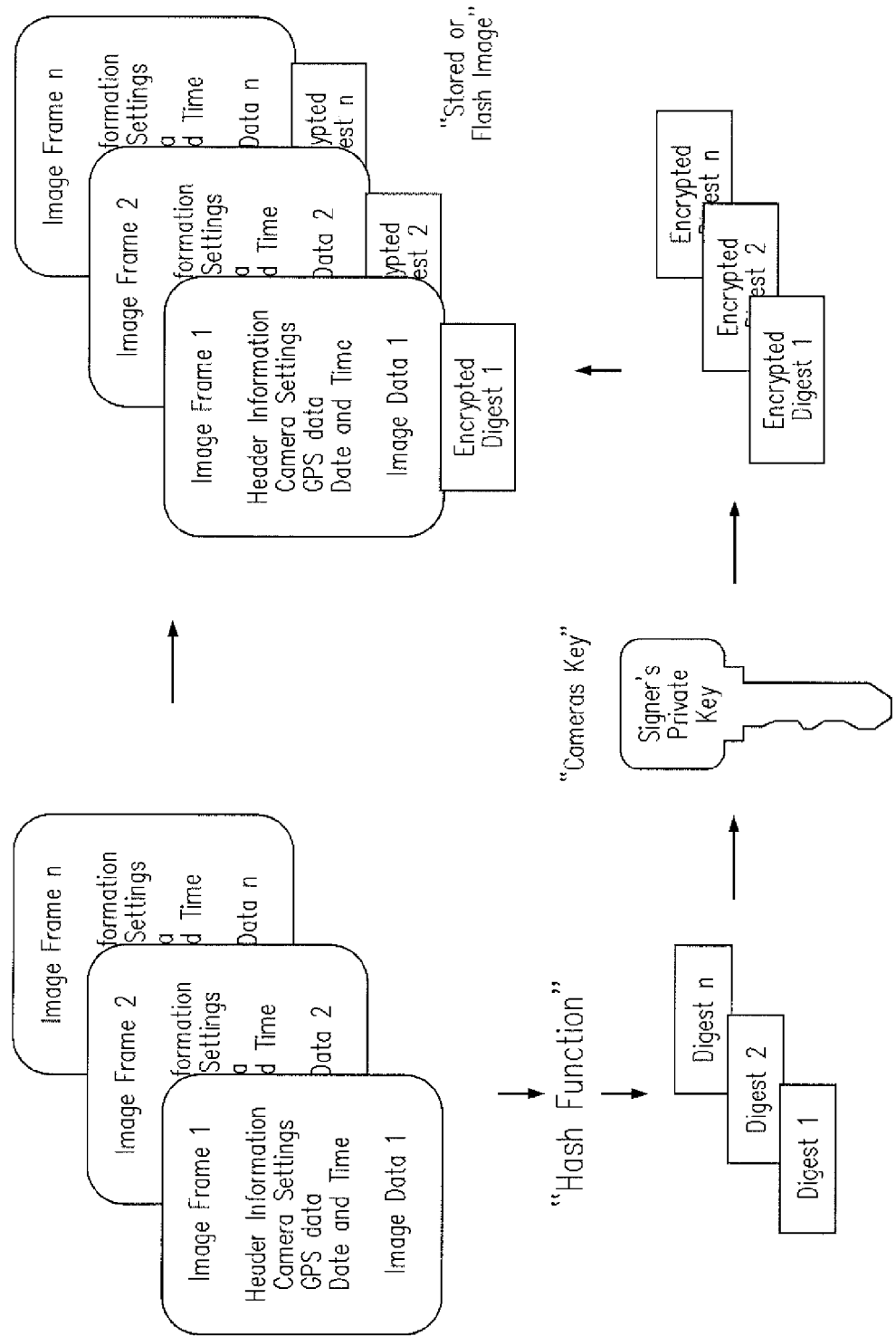
FIG. 12 shows an exemplary signing of the infrared image data in accordance with an embodiment of the present invention.
Figure 13:
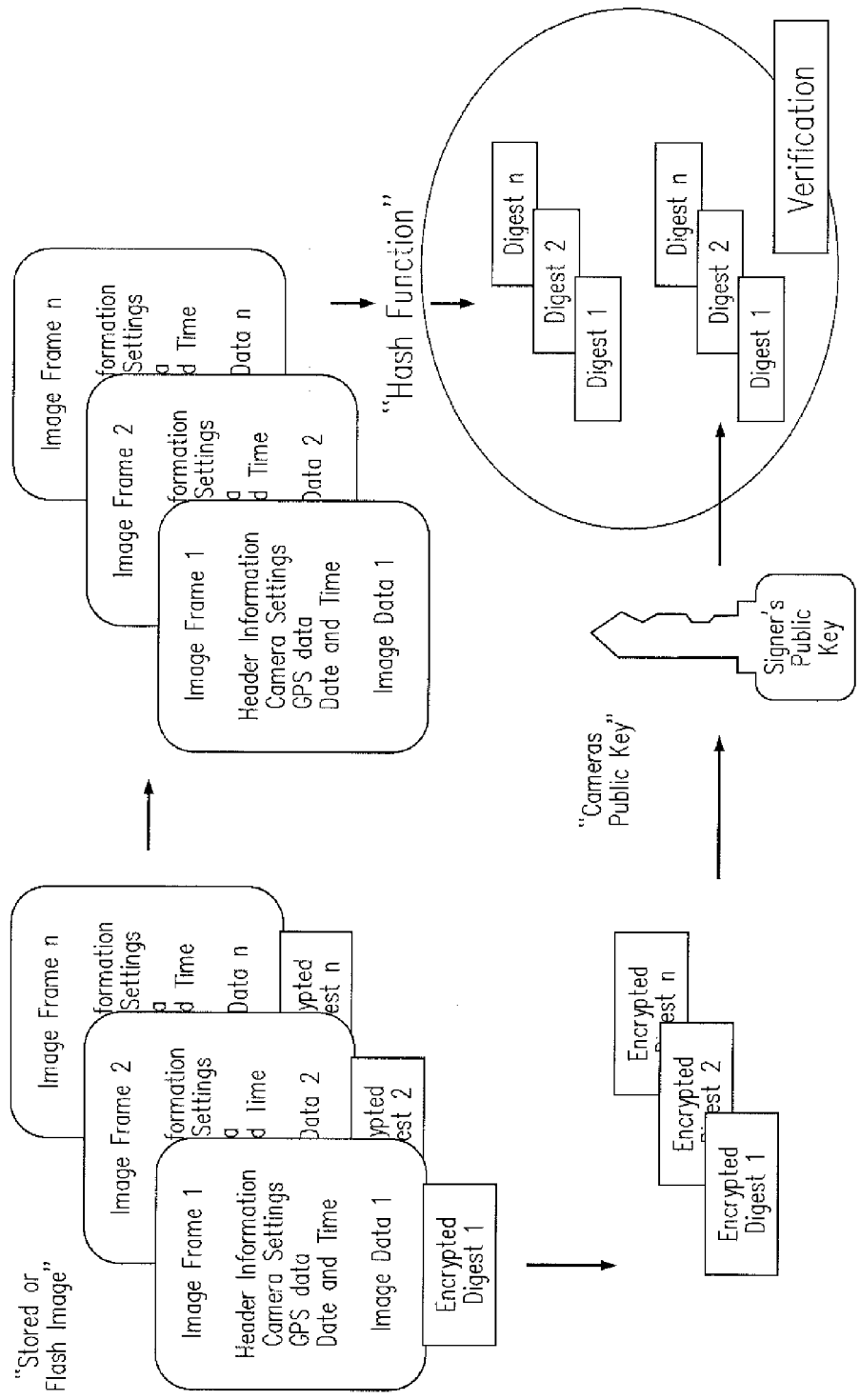
FIG. 13 shows an exemplary verification of the signed infrared image data of FIG. 12 in accordance with an embodiment of the present invention.

As an example, referring briefly to FIGS. 12 and 13, an example of data encryption or secure recordation for inspection system 104 is provided in accordance with an embodiment of the present invention. For this exemplary data encryption, a public private key infrastructure (PKI) is employed to generate a cryptographic signature for the image data (e.g., high resolution single frame or video data from video processing unit 208) and the header data (e.g., inspection information including camera settings, location, orientation, date, time, operator information, audio information, gas analysis information, electrical measurements, calculations, and/or target information).

As shown in FIG. 12, the image frame data (e.g., header and digital image data) is hashed and then signed with a private key located within inspection system 104 (e.g., within security processing unit 214, which may be provided by the operator of inspection system 104 and serve as an operator identification). The signed image information may then be stored and/or used as image information is normally used for camera applications, but with the added benefit of being fully verifiable via the associated encrypted digest information.

The verification is accomplished, as illustrated in FIG. 13, by rehashing the encrypted digest information and decrypting the signature with a public key, with the resulting digest information verified by comparing to the hashed image frame data. The image data and the header data cannot be tampered with without the private key, which is stored in inspection system 104.

The encrypted header or embedded information may be included, for example, based on the inspection route traveled by the inspector (e.g., to provide route-key tagging). The inspection route may be recorded, for example, because for each image, the location and time may be stored in the header and signed and, thus, a secure record of the inspection route is created. As an example, as an operator moves through a facility with inspection system 104 to inspect various targets, with camera settings, location, orientation, operator, time, date, radiometric parameters, audio information, gas analysis information, electrical measurements, and/or target information stored along with the corresponding image data. The image with header information may be hashed and signed with the signature stored along with the image. This information may then be reviewed via inspection system 104 or by downloading the information to a server or other type of data station (e.g., a computer or processor-based storage device) to verify the route traveled and the results of the inspections. Furthermore, the information may be downloaded and stored based upon the location or target information provided by inspection system 104. An external time or event server (not shown) may also be used to synchronize and report the time (e.g., tag time) or other event such as the inspection system entering a particular inspection location, time on station, and/or time traveling between stations, for example. The image date may be rehashed and the signature validated with the public key.

Figure 14:
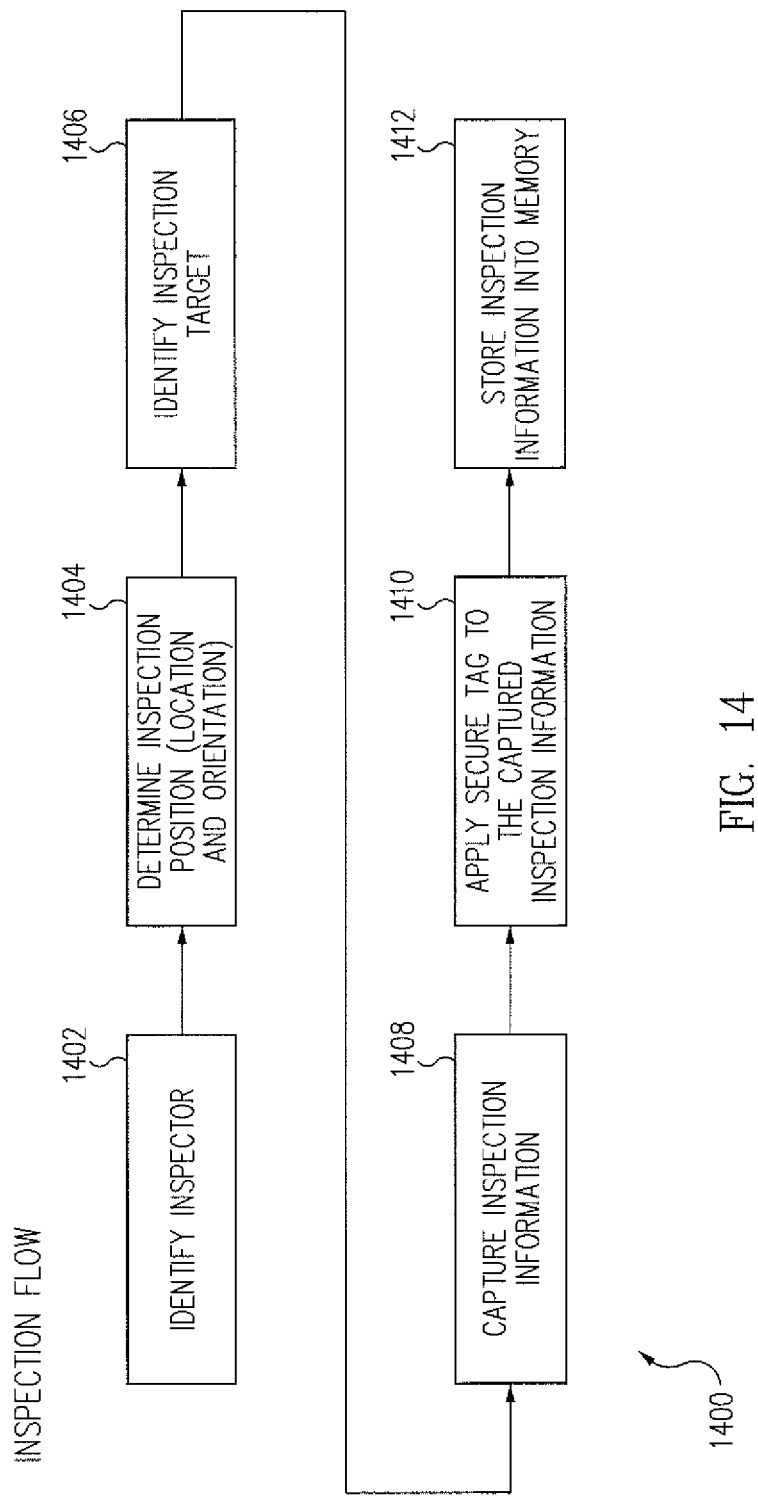
FIG. 14 shows an inspection flow, in accordance with an embodiment of the present invention.

FIG. 14 shows an exemplary inspection flow 1400 in accordance with an embodiment of the present invention. Inspection flow 1400 may include identifying an inspector or operator of the inspection system in operation 1402, determining an inspection position in operation 1404, identifying an inspection target in operation 1406, capturing inspection information (e.g., one or more images, sounds, or gas concentration measurements) in operation 1408, applying a secure tag (e.g., signature) to the inspection image in operation 1410, and storing the tagged inspection image into a memory in operation 1412. The tagged inspection image may be later transferred out of inspection system 104 to a server, a user, or a storage device through external connection 238, as shown in FIG. 2. It should be understood that one or more operations illustrated in inspection flow 1400 may be optional, depending upon the application or inspection requirements.

Operation 1402 includes, for example, operating inspector identification unit 202 to identify and/or record the inspector prior to performing an inspection (e.g., in order to avoid the case where an unauthorized or uncertified person may perform the inspection), as discussed in reference to FIGS. 2 and 3. Operation 1404 includes operating position determination unit 204 in order to determine the location and orientation of inspection system 104, as discussed in reference to FIGS. 2 and 4. Operation 1406 includes operating target identification unit 206 to identify an inspection target using one or more active or passive target identifiers, as discussed herein (e.g., in reference to FIGS. 1 and 5).

Operation 1408 includes capturing inspection information including for example one or more of image information, sound information, electrical measurements, and/or gas concentration information. In this manner, operation 1408 may include operating video processing unit 208 to capture one or more images and optionally applying a watermark, as discussed in reference to FIGS. 2 and 6. Operation 1408 may also include operating audio processing unit 210 (to capture one or more audio samples as discussed in reference to FIGS. 7, 8, and 9) and/or operating gas concentration detection unit 212 to detect the presence and concentration of one or more chemicals and/or chemical compounds as discussed in reference to FIG. 10. Operation 1408 may also include obtaining desired electrical data and/or calculation results as discussed previously and discussed further in reference to FIGS. 15-17. For example, the electrical data may be obtained from an electrical measurement device (e.g., by a wireless transfer of the data from the device to the inspection system) or by the operator reading the data from the device or from a control panel and entering the data into the inspection system.

Flow 1400 continues with operation 1410 that may include applying a secure tag to the captured inspection image (e.g., encrypting by signing or otherwise encoding information to secure the image data and associated information), as discussed herein (e.g., in reference to FIGS. 2 and 11-13). Flow 1400 concludes with storing the inspection information into a memory for later retrieval and transmission.

Figures 15, 16:
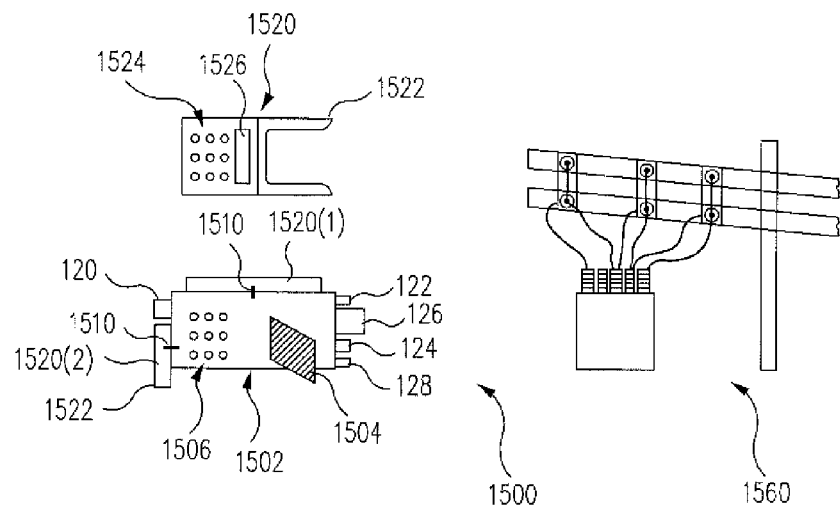

The techniques disclosed herein, as noted previously, may also be applied to the measurement of electrical devices, such as for example components of an electrical distribution network in accordance with one or more embodiments of the present invention. For example, FIG. 15 shows an inspection station 1560 that an inspection system 1500 may be used to examine (e.g., for possible electrical and/or temperature anomalies) in accordance with one or more embodiments of the present invention. Inspection station 1560 may represent a portion of an electrical distribution system (e.g., a component of an electrical distribution system such as a switch in a substation), but it should be understood that this is not limiting and that the techniques disclosed herein may be applied to any type of electrical device (e.g., a motor, a circuit breaker, or other type of circuit which may be designated as the target, such as target 106).

Inspection system 1500 includes an inspection system 1502 and an electrical measurement device 1520. For example, inspection system 1502 may represent an exemplary implementation of inspection system 104 (FIG. 2) and may include various functions and embodiments as discussed herein for inspection system 104, depending upon the desired application for inspection system 1502. For example, inspection system 1502 is shown without optional boom 116 and sensor 118, but these may be included if required for the desired application and specific implementation for inspection system 1502. Furthermore, inspection system 1502 may not include various features, such as inspector identification unit 202, position determination unit 204, target identification unit 206, audio processing unit 210, gas concentration detection unit 212, security processing unit 214, vibration analysis unit 216, and/or lubrication analysis unit 218, depending upon the application requirements for inspection system 1502.

For example, inspection system 1502 may represent an infrared camera (e.g., with video processing unit 208 and management unit 220) and may optionally include light 122, microphone 128, a display screen 1504, and/or data entry 1506. Display screen 1504 may represent a liquid crystal display or other type of viewable display for viewing by the operator infrared images captured by inspection system 1502 along with other information. Display screen 1504 may be in addition to or instead of display 120 (e.g., liquid crystal display screen or eyepiece viewer). Data entry 1506 represents a keypad or other types of buttons, switches, and/or knobs that allow an operator to enter information or control functions of inspection system 1502.

Inspection system 1502 may also include laser rangefinder 124, which may be used for example to determine a distance to an area of interest such as a portion of inspection station 1560. For example, for safety reasons, an operator of inspection system 1502 may need to maintain a safe distance from an electrical component of inspection station 1560 during the inspection due to potentially hazardous materials, high voltages, or due to rules or regulations pertaining to the site. The operator may also need the distance information to the target (e.g., electrical component) for data collection purposes to store (e.g., using techniques discussed herein) with the image as a reference and/or to perform temperature or load calculations, discussed further herein.

As an example, the operator using data entry 1506 may enter a minimum distance range into inspection system 1502.

Laser rangefinder 124 may periodically or continuously measure the distance from inspection system 1502 to the object (e.g., as the operator views and approaches target 106 such as inspection station 1560) and this information may be stored with the images (e.g., as similarly discussed previously for storing data with the images) and/or provided to the operator via display 1504. For example, if the measured distance becomes less than the minimum distance allowable as entered by the operator, a warning from inspection system 1502 may be provided to the operator in the form of a visible and/or audible warning to the operator.

As an example, the visible warning may include a visual change on display 1504 such as a flashing or constant display of a warning light or message. The warning light, for example, may be a color coded light or message on display 1504, with the color coding indicating the degree of the hazard or degree of the distance exceeded (e.g., a green color to indicate safe distance, a yellow color to indicate minimum distance reached, and a red color to indicate less than minimum distance).

As an example, the audible warning may include a sound emitted from a speaker (e.g., a conventional camera speaker) within inspection system 1502. The warning sound, for example, may be a siren or other audible tone (e.g., mono or multi-tone) or verbal warning (e.g., minimum distance reached) and the volume may vary depending upon the degree of the distance exceeded. Alternatively or in addition, inspection system 1502 may provide a vibration signal through inspection system 1502 (e.g., via a conventional handgrip for the infrared camera) to provide a warning to the operator (e.g., the vibration signal is likely to be perceived by the operator holding inspection system 1502).

Electrical measurement device 1520 may represent any type of electrical measurement device for measuring current, voltage, resistance, or performing other conventional electrical or magnetic measurements. For example, electrical measurement device 1520 may represent a multi-meter or a current meter, such as an amp meter or a clamp meter. As a specific example, electrical measurement device 1520 may represent an Ampstik®, which may be attached to a telescoping hot stick held by the operator of inspection system 1502.

Electrical measurement device 1520 may include data entry 1524, a display 1526, and/or probes 1522 in accordance with an embodiment of the present invention. Data entry 1524 represents a keypad or other user-operated controls for entering information into and controlling electrical measurement device 1520. Display 1526 represents a display for viewing by the operator. Probes 1522 are used by electrical measurement device 1520 to perform the desired measurements (e.g., measure current flowing through a line) as would be understood by one skilled in the art.

Electrical measurement device 1520 may be separate from or incorporated within inspection system 1502, depending upon the desired application and requirements. For example, electrical measurement device 1520 may be separate from inspection system 1502 to allow freedom of movement of electrical measurement device 1520, with the measurements and operation of electrical measurement device 1520 for example being recorded by inspection system 1502.

Electrical measurement device 1520 may communicate with inspection system 1502 via a wireless link, such as a radio frequency link (e.g., Wi-Fi™, Bluetooth™, or other conventional wireless protocols and standards) or an optical communication link. Alternatively, electrical measurement device 1520 may record the measurements and then transfer them when convenient to inspection system 1502 (e.g., via a USB connection or other conventional wired connection). As another alternative, the operator may enter the data from electrical measurement device 1520 via data entry 1506 into inspection system 1502. Thus, one or more of these techniques may be employed to perform measurements and transfer the data to inspection system 1502.

As a specific example, electrical measurement device 1520 may be couplable or permanently coupled to inspection system 1502. If couplable for example (i.e., not permanently attached), electrical measurement device 1520 may be detached by a user of inspection system 1502 to obtain electrical measurements (e.g., via a telescoping hot stick for high voltage applications) and then reattached to inspection system 1502. As shown in FIG. 15, electrical measurement device 1520 may be attached to inspection system 1502 to a top or bottom portion, side portion, etc. (as indicated by exemplary attachment of electrical measurement devices 1520(1) and 1520(2)). At the attachment position, a wired interface 1510 (e.g., a USB connection or other type of serial or parallel connection) may be used to transfer information between a portion of inspection system 1502 and electrical measurement device 1520. One or more electrical measurement devices 1520, for example, may be couplable to inspection system 1502 for a user to select to obtain the desired electrical measurements.

If electrical measurement device 1520 is permanently coupled to inspection system 1502 (e.g., for low voltage applications), for example, electrical measurement device 1520 may be attached to inspection system 1502 to allow a user to position electrical measurement device 1520 to obtain the desired electrical measurements. As an example, electrical measurement device 1520(2) is shown attached to inspection system 1502 so that a user of inspection system 1502 may position inspection system 1502 to allow probes 1522 to measure the electrical device under test and then position inspection system 1502 to obtain desired infrared images (e.g., with this information stored within inspection system 1502 as discussed herein, for example, in reference to FIGS. 12-14).

By employing inspection system 1502 with electrical measurement device 1520, information regarding the operation of an electrical device (e.g., inspection station 1560) may be determined. For example, inspection system 1502 may use the data collected, such as temperature or temperature changes recorded by the infrared camera of inspection system 1502 and/or electrical measurements from electrical measurement device 1520, to perform temperature estimates or electrical load estimates for the electrical device.

As a specific example, a temperature rise may be determined for a desired electrical load based on a measured load and a measured temperature. Specifically, given a temperature rise ($\Delta T_{meas}$) of an electrical component (e.g., target 106 such as a component of inspection station 1560) measured with the infrared (IR) camera of inspection system 1502, and also given the electrical current ($I_{meas}$) through the electrical component (load) along with the maximum current ($I_{max}$) allowed through the electrical component (load), equation (1) below may be used to calculate the temperature rise ($\Delta T_{calc}$) expected for a desired load (e.g., maximum load). The electrical current ($I_{meas}$) through the electrical component may be determined using electrical measurement device 1520 or by providing or knowing through on-site instrumentation or other electrical control equipment (e.g., control panel) or equipment personnel the amount of current flowing through the electrical component.

$$\Delta T_{calc} = \Delta T_{meas} \left( \frac{I_{max}}{I_{meas}} \right)^n \quad (1)$$

As an example in accordance with an embodiment of the present invention, FIG. 16 illustrates an example of a display screen format that may be provided on display 1504 to guide the operator in providing the desired input data for calculating a desired result for the operator based on equation (1). The operator, for example, may enter the desired information (or select the desired values transferred from electrical measurement device 1520) and command that the calculation be performed by inspection system 1502.

For example, for a measured load of 300 amps, a maximum load of 600 amps, and a measured temperature rise of 150° F., the calculated temperature rise would be in a range from a low of 413° F. (using n=1.46) to a high of 480° F. (using n=1.68) with an average value of 447° F. The calculation result may be based on the average value as an estimate, because determining the target's emissivity may be difficult for the operator at the target's location. The temperature rise, for example, may be determined as the difference between the problem spot (e.g., a portion of the target) and a similar portion on a similar electrical component under the same load and environmental conditions.

Equation (1) is based on a calculation of the convective and radiative heat transfer from the target. As such, the target's emissivity and the reflected apparent temperature may be important variables. It should also be noted that equation (1) does not correct for wind speed and is based on a zero wind speed at the target's location.

The value of "n" may be estimated or determined, for example, based on simulations (e.g., a value of n may range from 1.0 to 1.9). As an example, the effects of changing load for various emissivity targets, air temperatures, and background temperatures may be determined, as would be understood by one skilled in the art. The resulting data may then be fit for equation (1) to find n for various conditions. Generally, modeling and simulations indicate that there may be no single value for n for all cases and thus there is no simple load correction factor. However, a range of exponents (e.g., n values) may be used to provide a reasonable estimate, such as for example from a high of 1.68 to a low of 1.46 for the value of n.

For example, modeling and simulations may consider a low emissivity target (e.g., minimum of 0.6) to a high emissivity target (e.g., maximum of 0.95), with an air temperature of about 70° F., a background temperature ranging from 70° F. to −13° F., and a simulated target 4" wide by 1" thick by 6" tall. The value of n typically decreases as the heat transfer by radiation increases, due to its non-linear (e.g., $T^4$) nature, with the strongest radiation occurring for high emissivity, low background targets.

As another specific example, an electrical load (e.g., maximum load) may be determined that would not exceed a maximum temperature given a temperature rise for a given electrical load. Specifically, equation (1) may be rearranged to provide equation (2) as shown below.

$$I_{max} = I_{meas} \left( \frac{\Delta T_{max}}{\Delta T_{meas}} \right)^{\frac{1}{n}} \quad (2)$$

For equation (2), the maximum load ($I_{max}$) is calculated given the measured load ($I_{meas}$), the maximum allowable temperature rise ($\Delta T_{max}$), and the measured temperature rise ($\Delta T_{meas}$), with n being an exponent determined as discussed above. For example, for a measured temperature rise of 200° F., a measured load of 300 amps, and a maximum allowable temperature rise of 350° F., the calculated $I_{max}$ ranges from 419 amps (n=1.68) to 440 amps (n=1.46), with an average of 429 amps. It should be noted that units for temperature (temperature scale) for equation (2) should be consistent as the temperatures are a ratio, with the ratio units merely needing to be consistent (e.g., ° F. or ° C.).

As an example in accordance with an embodiment of the present invention, FIG. 17 illustrates an example of a display screen format that may be provided on display 1504 to guide the operator in providing the desired input data for calculating a desired result for the operator based on equation (2). The operator, for example, may enter the desired information (or select the desired values transferred from electrical measurement device 1520) and command that the calculation be performed by inspection system 1502.

In general in accordance with an embodiment of the present invention, inspection system 1500 may provide certain advantages over conventional approaches for inspecting electrical equipment. For example, a thermographer may utilize the infrared images provided by inspection system 1502 to obtain temperature measurements and use electrical measurement device 1504 to obtain electrical measurements, with various information calculated by inspection system 1502 based on the measurements. Inspection system 1502 may also provide safety information (e.g., safe distance perimeter) to the operator and may securely store the measurements, calculations, distance, and/or other information with the infrared images, as discussed herein. As a specific example, the thermographer's identification may be verified (e.g., unit 202), position determined (e.g., unit 204), target identified (e.g., unit 206), audio notes recorded (e.g., unit 210), inspection route stored, and/or other parameters, measurements, or calculations securely stored along with the infrared images (e.g., JPEG file) using the techniques disclosed herein.

Systems and methods are disclosed herein to provide an inspection system in accordance with one or more embodiments of the present invention. The inspection systems and methods disclosed herein may be employed, for example in accordance with one or more embodiments of the present invention, in a wide variety of applications. For example, an inspection system may be utilized to provide production facility monitoring and compliance verification, security surveillance, nuclear power plant predictive and preventative maintenance, and other monitoring and surveillance or compliance activities. As another example, an inspection system may be utilized by law enforcement or military to record engagements or record arrest or pursuit activities with secure recordation of the data (e.g., for evidentiary functions). As a further example, the inspection system may be employed to perform electrical equipment inspection (e.g., to check for hot spots, defects, and/or potential failure points) and may also perform calculations to determine safe operating ranges.

Embodiments described above illustrate but do not limit the invention. It should also be understood that numerous modifications and variations are possible in accordance with the principles of the present invention. Accordingly, the scope of the invention is defined only by the following claims.

We claim:

1. A portable inspection system for inspecting a target in a scene, comprising:
   an infrared camera comprising, within a housing, a multi-pixel infrared detector configured to receive infrared radiation from an area of the scene within a field of view (FOV) and to generate infrared image data of the area of the scene within the FOV;

a display configured to display viewable images;

a processor coupled to the infrared camera and the display and configured to process the infrared image data to view as an infrared image on the display;

one or more non-imaging sensors configured to detect one or more physical parameters associated with the target and to provide the one or more physical parameters to the processor; and a boom having its distal end couplable to at least one of the one or more non-imaging sensors to position the at least one non-imaging sensor relative to the FOV of the multi-pixel infrared detector, wherein one of the one or more non-imaging sensors comprises a plurality of microphones configured to capture stereoscopic sound data from the scene and to provide the stereoscopic sound data to the processor, and wherein the processor is adapted to analyze the stereoscopic sound data to determine a location of a gas leak from the scene and to associate the location of the gas leak with the infrared image data.

2. The portable inspection system of claim 1, wherein the processor is further configured to provide visual cues based on the stereoscopic sound data to the display to direct a user of the portable inspection system to the location of the gas leak.

3. The portable inspection system of claim 1, wherein at least one of the one or more non-imaging sensors is configured to wirelessly communicate with the processor.

4. The portable inspection system of claim 1, wherein the boom is couplable to the housing of the infrared camera and configured to selectively position the at least one of the one or more non-imaging sensors within or out of the FOV of the multi-pixel infrared detector.

5. The portable inspection system of claim 1, wherein the one or more non-imaging sensors comprise a gas measurement device configured to detect a presence and/or a concentration of at least one gas in a vicinity of the target to provide gas detection and/or concentration information to the processor.

6. The portable inspection system of claim 1, wherein the non-imaging one or more sensors comprise an electrical measurement device configured to measure electrical current, voltage, and/or resistance to provide electrical measurement information to the processor.

7. A portable inspection system for inspecting a target in a scene, comprising:

an infrared camera comprising, within a housing, a multi-pixel infrared detector configured to receive infrared radiation from an area of the scene within a field of view (FOV) and to generate infrared image data of the area of the scene within the FOV;

a display configured to display viewable images;

a processor coupled to the infrared camera and the display and configured to process the infrared image data to view as an infrared image on the display; and one or more non-imaging sensors configured to detect one or more physical parameters associated with the target and to provide the one or more physical parameters to the processor, wherein the one or more non-imaging sensors include a rangefinder configured to measure a distance to the target and to provide the distance measurement to the processor, wherein the processor is adapted to compare the distance measurement with a safe distance range to the target to generate a safe distance perimeter indication for alerting a user of the portable inspection system, and wherein the display is further configured to display the safe distance perimeter indication along with the infrared image on a screen for viewing by the user.

8. The portable inspection system of claim 7, wherein the display is further configured to display the distance measurement along with the infrared image, and wherein the safe distance perimeter indication is displayed as a color-coded warning corresponding to a degree of hazard to the user's safety based on the distance measurement and the safe distance range.

9. The portable inspection system of claim 8, wherein the color-coded warning provides a first color to indicate a safe distance, a second color to indicate a minimum distance range, and a third color to indicate a less than safe minimum distance.

10. The portable inspection system of claim 7, further comprising a speaker coupled to the processor and configured to provide the safe distance perimeter indication as an audible warning.

11. The portable inspection system of claim 7, further comprising a data entry device configured to allow the user to enter information into the portable inspection system, wherein the safe distance range is received via the data entry device.

12. The portable inspection system of claim 7, further comprising a boom having its distal end couplable to at least one of the one or more non-imaging sensors to position the at least one non-imaging sensor relative to the FOV of the multi-pixel infrared detector.

13. The portable inspection system of claim 7, wherein at least one of the one or more non-imaging sensors is configured to wirelessly communicate with the processor.

14. The portable inspection system of claim 7, wherein at least one of the one or more non-imaging sensors is detachably attached to the housing of the infrared camera.

15. The portable inspection system of claim 7, wherein the one or more non-imaging sensors comprise a gas measurement device configured to detect a presence and/or a concentration of at least one gas in a vicinity of the target to provide gas detection and/or concentration information to the processor.

16. The portable inspection system of claim 7, wherein the one or more non-imaging sensors comprise an electrical measurement device adapted to measure electrical current, voltage, and/or resistance to provide electrical measurement information to the processor.

17. A method of inspecting a target in a scene using a portable inspection system, the method comprising:

receiving, at a multi-pixel infrared detector of an infrared camera, infrared radiation from an area of the scene within a field of view (FOV) of the multi-pixel infrared detector;

generating infrared image data of the area of the scene within the FOV using the infrared camera of the portable inspection system, in response to the receiving of the infrared radiation;

processing the infrared image data with a processor of the portable inspection system;

displaying an infrared image corresponding to the infrared image data for viewing by a user on a display of the portable inspection system;

positioning one or more non-imaging sensors relative to the FOV of and at a distance from the multi-pixel infrared detector;

detecting one or more physical parameters associated with the target using the one or more non-imaging sensors;

determining a distance to the target with a rangefinder of the portable inspection system; and displaying a visible warning on the display along with the infrared image to alert a user of the portable inspection system based on a comparison of the determined distance with a safe distance range to the target.

18. The method of claim 17, wherein the visible warning comprises a color-coded warning corresponding to a degree of hazard to the user's safety based on the comparison.

19. The method of claim 17, further comprising generating an audible warning using a speaker of the portable inspection system to alert the user based on the comparison of the determined distance with the safe distance range to the target.

20. The method of claim 17, further comprising wirelessly communicating the detected physical parameters from the one or more non-imaging sensors to the portable inspection system.

* * * * *